(12) United States Patent
Shimizu et al.

(10) Patent No.: US 8,084,127 B2
(45) Date of Patent: Dec. 27, 2011

(54) MOLYBDENUM OR TUNGSTEN PARTICLES, THIN FILM FORMED FROM SAID PARTICLES, AND PROCESS FOR PRODUCING THE SAME

(75) Inventors: Yoshiki Shimizu, Ibaraki (JP); Takeshi Sasaki, Ibaraki (JP); Naoto Koshizaki, Ibaraki (JP); Kazuo Tereshima, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 976 days.

(21) Appl. No.: 12/036,336

(22) Filed: Feb. 25, 2008

(65) Prior Publication Data

US 2008/0206552 A1 Aug. 28, 2008

(30) Foreign Application Priority Data

Feb. 26, 2007 (JP) ................. 2007-045750

(51) Int. Cl.
*B32B 15/00* (2006.01)
*B32B 15/02* (2006.01)
(52) U.S. Cl. ......... 428/402; 428/469; 428/660; 428/546
(58) Field of Classification Search .................. 428/546, 428/548, 357, 402, 328; 427/576; 420/429
See application file for complete search history.

(56) References Cited

OTHER PUBLICATIONS

Xiao-Hui Wang, et al., "Synthesis and characterization of molybdenum carbides using propane as carbon source," Journal of Solid State Chemistry, vol. 179, Issue 2, Feb. 2006, pp. 538-543.*

K L Chopra et al, "Face-Centered-Cubic Tungsten Films Obtained," Appl Phys Letters, 9, 1966, 402-405, Vacuum, vol. 17, Issue 9, Sep. 1967, p. 539.*
F. Jona et al, "The Crystal Structure and Stability of Molybdenum at Ultrahigh Pressures", J. Phys. Condens. Matter, vol. 17, pp. 1049-1057, Jan. 28, 2005.
N. E. Christensen et al., "Pressure Strengthening: A way to Multimegabar Static Pressures", The Americal Physics Society, Physical Review B, vol. 52, No. 13, pp. 9121-9124, Oct. 1, 1995.
T. Vystavel et al., "Structural Dynamics of Gas-Phase Molybdenum Nanoclusters: A transmission Electron Microscopy Study", American Institute of Physics, Applied Physics Letters, vol. 86, pp. 113113-1 to 113113-3, Mar. 14, 2005.
H. Hofmeister, "Fivefold Twinned Nanoparticles", Encyclopedia of Nanoscience and Nanotechnology, vol. 3, pp. 431-452, 2003 (month unknown).
I. Lisiecki et al., "Structural Investigation of Copper Nanorods by High-Resolution TEM", The Americal Physics Society, Physical Review B, vol. 61, No. 7, pp. 4968-4974, Feb. 15, 2001.
Christopher J. Johnson et al., "Growth and form of Gold Nanorods Prepared by Seed-Mediated, Surfactant-Directed Synthesis", The Royal Society of Chemistry, J. Mater. Chem. vol. 12, pp. 1765-1770, Apr. 16, 2002.

(Continued)

*Primary Examiner* — Jennifer McNeil
*Assistant Examiner* — Daniel J Schleis
(74) *Attorney, Agent, or Firm* — Howson & Howson LLP

(57) ABSTRACT

Proposed are molybdenum or tungsten particles having a stable face-centered cubic structure of molybdenum and tungsten belonging to a VI group in a periodic table or a thin film formed from the foregoing particles, and a manufacturing method thereof. Specifically, provided are molybdenum or tungsten particles having a face-centered cubic (fcc) crystal structure or a thin film formed from the foregoing particles, wherein the particles have a large-diameter particle structure that is thermodynamically stable or metastable; and molybdenum or tungsten particles having a face-centered cubic (fcc) crystal structure or a thin film formed from the foregoing particles, wherein the particles have a pentagonal and star-shaped particle structure.

6 Claims, 4 Drawing Sheets

OTHER PUBLICATIONS

Yugang Sun et al., "Polyol Synthesis of Uniform Silver Nanowires: A Plausible Growth Mechanism and the Supporting Evidence", American Chemical Society, Nano Letters, vol. 3, No. 7, pp. 955-960, May 15, 2002.

* cited by examiner

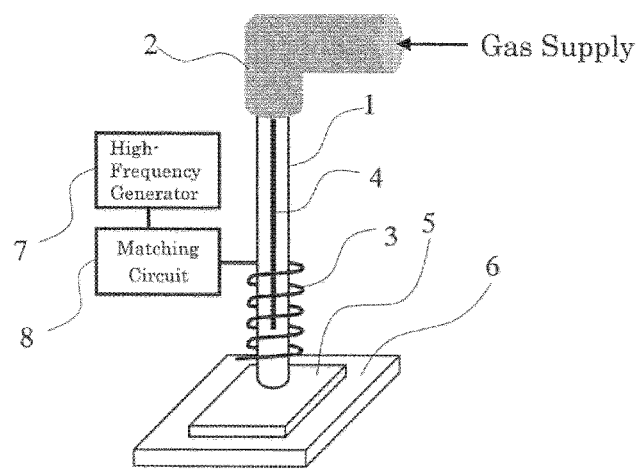
[Figure 1]
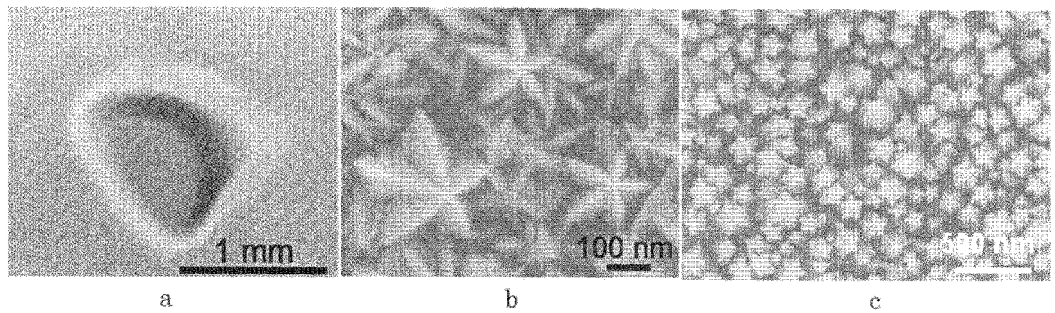
[Figure 2]
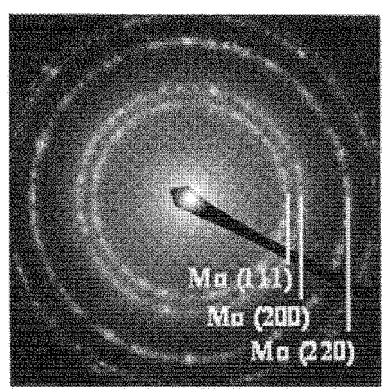
[Figure 3]

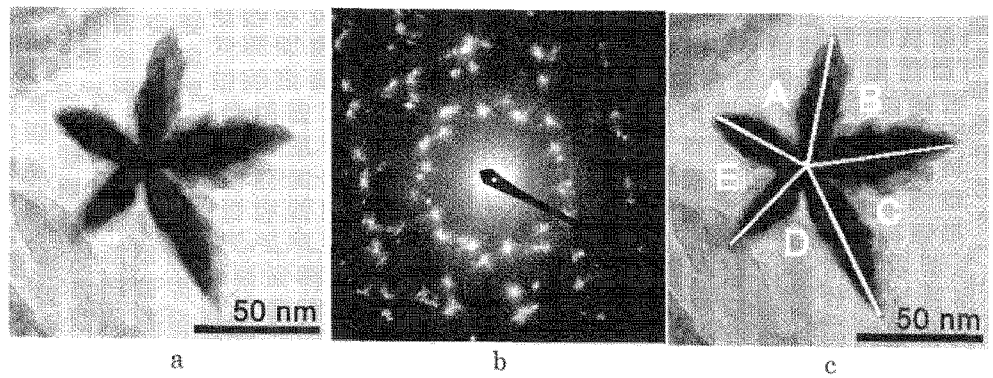
[Figure 4]
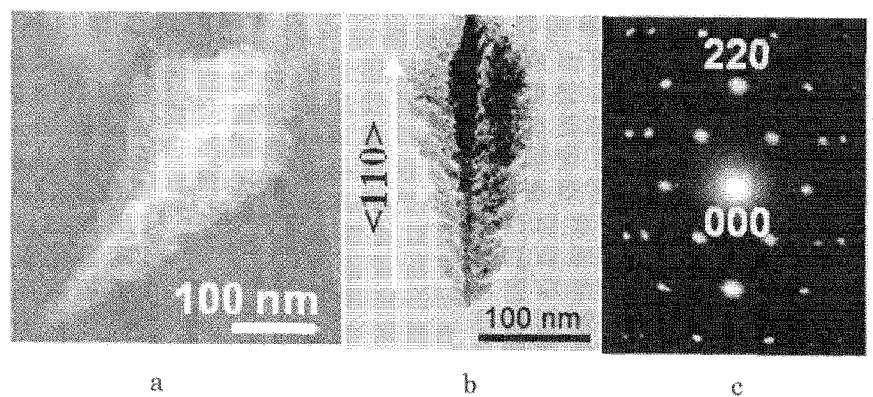
[Figure 5]
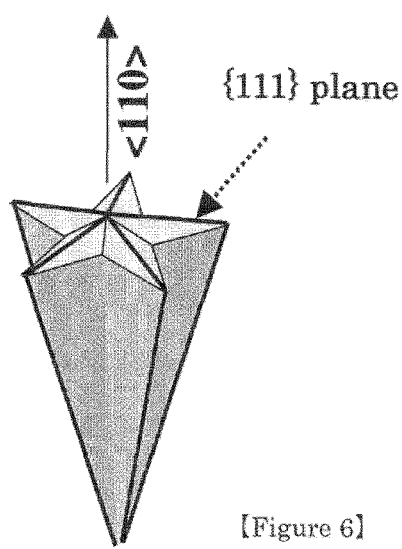
[Figure 6]

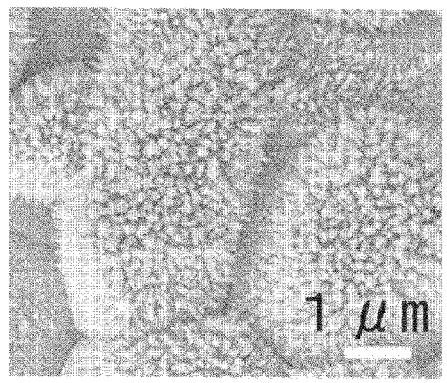
[Figure 7]
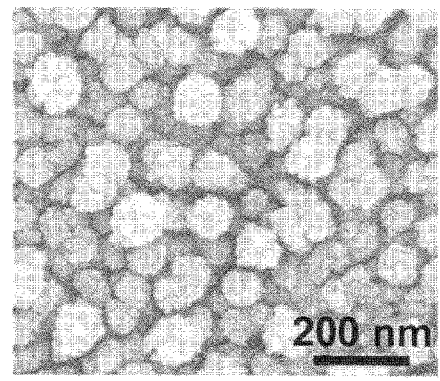
[Figure 8]
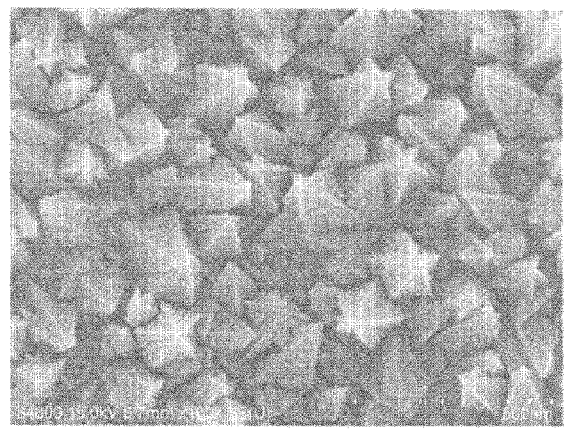
[Figure 9]

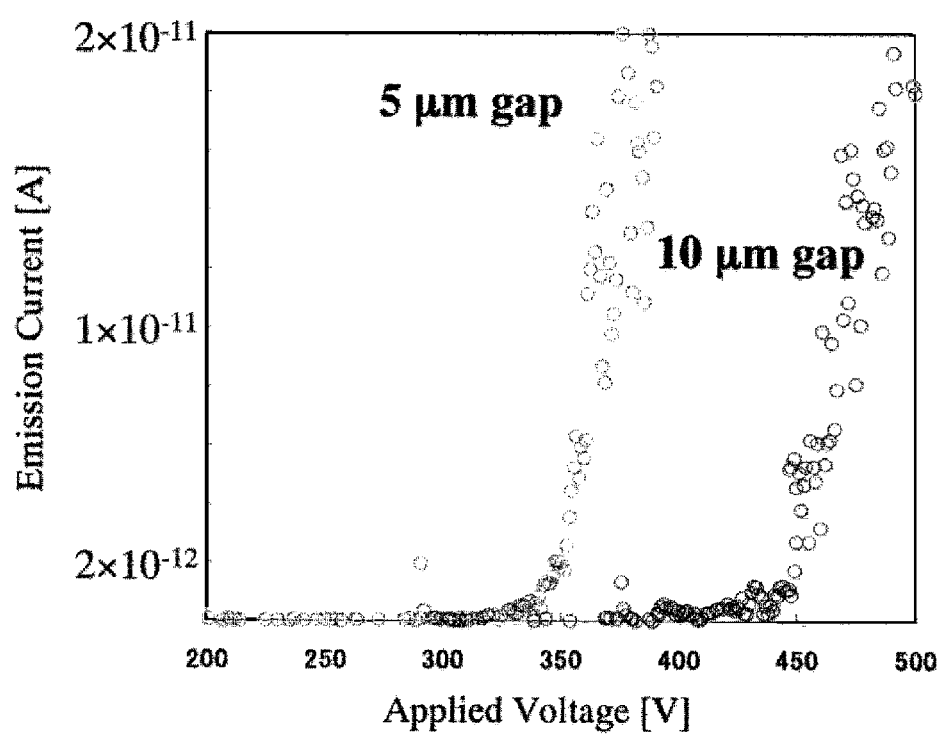
[Figure 10]

MOLYBDENUM OR TUNGSTEN PARTICLES, THIN FILM FORMED FROM SAID PARTICLES, AND PROCESS FOR PRODUCING THE SAME

BACKGROUND OF THE INVENTION

The present invention relates to molybdenum or tungsten particles having a stable face-centered cubic structure of molybdenum and tungsten belonging to a VI group in a periodic table or a thin film formed from the foregoing particles, and a manufacturing method thereof.

Molybdenum and tungsten belonging to a VI group in a periodic table is a high-melting material that is used as an electrode material or the like, and there are four known types of crystal structures thereof, namely, amorphous, body-centered cubic (bcc) structure, hexagonal close-packed (hcp) structure, and face-centered cubic (fcc) structure. Among the foregoing crystal structures, the bcc structure is a thermodynamically stable structure. Contrarily, the hcp or fcc structure is a thermodynamically metastable structure. If the molybdenum and tungsten of the bcc structure are subject to high-temperature and high-pressure treatment, they will be subject to phase transformation and synthesis in the order of bcc→hcp→fcc (refer to Non-Patent Documents 1 and 2).

Meanwhile, in the field of cluster science that deals with clusters in the size of several nanometers, stable crystal structures are being discussed from the perspective of surface energy. With clusters having a size of 4 nm or greater, the bcc structure or the A15 structure, which is a slightly distorted version of the bcc structure, is stable. If the size of clusters becomes less than 4 nm, the surface stability caused by the reduction in surface energy is to be the driving force and the fcc structure will appear. An example where a molybdenum plate was sputtered and synthesized in a chamber, which was filled with argon gas and adjusted so that the pressure was to be 0.1 mbar or less, has been reported (refer to Non-Patent Document 3).

Elements having the fcc structure are known to create nanoparticles having crystallographically five-fold symmetry. For example, with elements such as gold, silver, copper, germanium and silicon, in which the thermodynamically stable structure is an fcc structure, numerous nanoparticles having five-fold symmetry such as decahedron or icosahedron have been observed in the nanoparticles created during the process of evaporating and condensing the ingots of the foregoing elements (refer 10 to Non-Patent Document 4). This is based on the fact that the basic structure of a pentagonal substance is an fcc structure. Five units having an fcc structure are arranged around a single axis (five-fold symmetrical axis), and it results in the formation of a pentagonal structure.

In recent years, the synthesis of nanorods in which gold, silver and copper decahedrons grow in a one-dimensional direction along the five-fold symmetrical axis has also been reported (refer to Non-Patent Documents 5 to 7). Meanwhile, since the thermodynamically stable structure of molybdenum and tungsten belonging to the VI group in a periodic table is a bcc structure as described above, the creation of a pentagonal substance has not been reported thus far.

[Non-Patent Document 1] J. Phys.: Condense Matter 17, 1049-1057, (2005)

[Non-Patent Document 2] Physical Review B, 52, 9121-9124 (1994)

[Non-Patent Document 3] Appl. Phys. Lett, 86, 113113 (2005)

[Non-Patent Document 4] Encyclopedia of Nanoscience and Nanotechnology, Volume X, 1-22 (2003)

[Non-Patent Document 5] Physical Review B, 61, 4968-4874 (2000)

[Non-Patent Document 6] J. Mater. Chem, 12, 1765-1770 (2002)

[Non-Patent Document 7] Nano Letters, 3, 955-960 (2003)

SUMMARY OF THE INVENTION

Particulates having a pentagonal and star-shaped (five-fold symmetrical) structure are normally synthesized by a method of evaporating and condensing raw material solids (mainly rod-shaped solids), or via colloid synthesis. These synthesizing methods are suitable for the synthesis of pentagonal particulates of substances (elements) in which the thermodynamically stable structure thereof is an fcc structure. Nevertheless, the foregoing synthesizing methods are not suitable for the synthesis of substances such as molybdenum and tungsten in which the fcc structure is thermodynamically metastable, and the synthesis of these five-fold symmetrical substances have not been reported thus far. The present invention was devised in view of the foregoing problems, and an object thereof is to provide molybdenum or tungsten particles having a stable face-centered cubic structure of molybdenum and tungsten belonging to a VI group in a periodic table or a thin film formed from the foregoing particles, and a manufacturing method thereof.

Specifically, provided are molybdenum or tungsten particles having a face-centered cubic (fcc) crystal structure or a thin film formed from the foregoing particles, wherein the particles have a large-diameter particle structure that is thermodynamically stable or metastable. The molybdenum or tungsten particulates having an fcc structure of the present invention include pentagonal particulates in which the individual particles have a spherical shape or a star-shaped cross-section. In other words, the present invention provides molybdenum or tungsten particles having a face-centered cubic (fcc) crystal structure or a thin film formed from the foregoing particles, wherein the particles have a pentagonal and star-shaped particle structure. The average grain size of the molybdenum or tungsten particles is 50 nm or greater. As shown in the diagrams described later, the present invention enables to attain the average grain size of 100 nm or greater, and even 200 nm or greater.

As a specific feature of the molybdenum or tungsten particles or the thin film formed from the foregoing particles of the present invention, the individual particles are pentagonal particles having a star-shaped cross-section. The present invention enables to provide the molybdenum or tungsten particles grown in a uniaxial direction along orientation <110> of a five-fold symmetrical axis, or the thin film formed from the foregoing particles. In addition, with the molybdenum or tungsten particles or the thin film formed from the foregoing particles of the present invention, the individual particles are five-fold symmetrical particles having a star-shaped cross-section and a structure laterally grown in a star shape from the five-fold symmetrical axis, or the thin film formed from the foregoing particles.

Moreover, the present invention additionally provides molybdenum or tungsten particles or the thin film formed from the foregoing particles comprising a twin plane {111} in the center of a protrusion. The pentagonal and star-shaped five-fold symmetrical particulates are grown in a one-dimensional direction along the five-fold symmetrical axis, and are also laterally grown in 5 specific directions. The size of the particles has reached several hundred nm, and these are larger crystal grains than conventionally synthesized molybdenum having the fcc structure. The present invention enables to deposit these particles onto a substrate and form a thin film.

The present invention further provides a manufacturing method of molybdenum or tungsten particles or a thin film formed from the foregoing particles in which the particles have a face-centered cubic (fcc) crystal structure, comprising the steps of placing molybdenum or tungsten as a raw material for forming a thin film in one or more narrow tubes of which the internal diameter is even throughout, generating high frequency plasma in the narrow tubes by introducing inert gas into the narrow tubes and applying high frequency voltage, heating and evaporating the raw material while maintaining the flow rate of plasma gas in the narrow tubes and the plasma gas temperature at high heat, discharging the evaporated material from the narrow tubes, irradiating the evaporated material onto a substrate, heating the substrate with the plasma gas, and depositing the irradiated material onto the substrate at atmospheric pressure. In other words, the present invention enables to prepare molybdenum and tungsten particulates having an fcc structure in the atmosphere and at normal pressure, and thereby provide molybdenum or tungsten particulates having an fcc structure as well as a thin film formed from the foregoing particulates.

In order to synthesize molybdenum or tungsten pentagonal particles, synthesizing methods under an environment that is advantageous for the creation of nonequilibrium substances are considered to be suitable. In this respect, a method using plasma is a synthesizing means that is capable of providing a nonequilibrium environment with relative ease. Among the various types of plasmas, since microplasma having a size of a micrometer order is small, the residence time of the raw material in the plasma is short, and the structure before the substance transforms into a thermodynamically stable structure, namely the metastable structure, can be frozen as is. Thus, the method using microplasma is optimal for synthesizing substances such as molybdenum or tungsten having an fcc structure (metastable structure). The present inventors discovered that it is possible to prepare molybdenum and tungsten pentagonal and star-shaped particles having an fcc structure in the atmosphere and at normal pressure, and as well as a thin film formed from the foregoing particles, by using the previously developed microplasma method (refer to Japanese Patent Application No. 2006-225695).

In addition, it is possible to prepare the following molybdenum or tungsten particles or a thin film formed from the foregoing particles by arbitrarily setting the manufacturing conditions of the molybdenum or tungsten particles or the thin film formed from the foregoing particles. In other words, it is possible to prepare particles having a face-centered cubic (fcc) crystal structure or a thin film formed from the foregoing particles wherein the particles have a pentagonal and star-shaped particle structure; particles or a thin film formed from the foregoing particles wherein the average grain size of the particles is 50 nm or greater; particles or a thin film formed from the foregoing particles wherein the individual particles have a spherical shape or a star-shaped cross-section; particles or a thin film formed from the foregoing particles wherein the individual particles are five-fold symmetrical particles having a star-shaped cross-section and grown in a uniaxial direction along orientation <110> of a five-fold symmetrical axis; particles or a thin film formed from the foregoing particles wherein the individual particles are five-fold symmetrical particles having a star-shaped cross-section and a structure laterally grown in a star shape from the five-fold symmetrical axis; and particles or a thin film formed from the foregoing particles comprising a twin plane {111} in the center of a protrusion. The present invention covers all of the foregoing particles and thin films.

The method of manufacturing molybdenum or tungsten particles and a thin film formed from the foregoing particles employing the microplasma method of the present invention can adopt the following techniques. These techniques can be arbitrarily selected and adjusted. Specifically, a method of generating high-temperature plasma gas by introducing hydrogen gas together with inert gas into a narrow tube; a method of arranging an RF electrode in a narrow tube or up to an area in the vicinity of the nozzle of a narrow tube and maintaining the plasma gas temperature at high heat; a method of using metal or an alloy wire as a raw material to form the objective substances on a substrate; a method of placing a raw material for forming a thin film in one or more narrow tubes, generating high frequency plasma in the narrow tubes by introducing inert gas into the narrow tubes and applying high frequency voltage, heating and evaporating the raw material while maintaining the flow rate of plasma gas in the narrow tubes and the plasma gas temperature at high heat, discharging the evaporated material from the narrow tubes, irradiating the evaporated material onto a substrate, heating the substrate with the plasma gas, and irradiating reactive gas on the substrate at the perimeter by the use of another narrow tube that is different from the foregoing narrow tubes so as to react the material deposited on the substrate with the reactive gas for forming a compound of the foregoing material; a method of controlling the thickness of the film to be deposited as well as the substance and area by relatively displacing the substrate and the narrow tube for generating plasma to be used for irradiating the evaporated material onto the substrate; and a method of aligning a plurality of narrow tubes on a substrate for generating plasma to be used for irradiating the evaporated material onto the substrate, controlling the thickness of the film to be deposited as well as the substance and area by relatively displacing the foregoing narrow tubes, and thereby forming a large-area thin film. The present invention covers all of the foregoing methods.

The fcc structure of molybdenum or tungsten obtained with conventional methods was a cluster having a size of several nm, and the obtained amount was also minute. Contrarily, since the present invention enables to obtain particles having a size of several hundred nm or a thin film formed from the foregoing particles as described above, it yields a superior effect of enabling the measurement of physical properties of molybdenum and tungsten having an fcc structure, which used to be difficult to do.

BRIEF DESCRIPTION OF THE DRAWINGS

FIG. 1 is an overview showing an example of an atmospheric-pressure microplasma thin-film formation apparatus for implementing the present invention;

FIG. 2a to FIG. 2c are diagrams showing the scanning electron micrograph of pentagonal and star-shaped molybdenum particles having an fcc structure formed on a substrate (FIG. 2a is a photograph of the overall area irradiated with plasma; FIG. 2b is a high magnification observation photograph of the irradiated area; and FIG. 2c is a medium magnification observation photograph);

FIG. 3 is a photograph showing an electron diffraction pattern obtained from a plurality of star-shaped molybdenum particles;

FIG. 4a is a transmission electron micrograph of star-shaped molybdenum particles observed from the overhead direction; FIG. 4b is an electron diffraction pattern corresponding to FIG. 4a; and FIG. 4c is an explanatory diagram of star-shaped molybdenum particles configured from 5 fcc structure units;

FIG. 5a to FIG. 5c are observation photographs of the star-shaped molybdenum particles from the lateral direction (FIG. 5a is a scanning electron micrograph; FIG. 5b is a transmission electron micrograph; and FIG. 5c is an electron diffraction pattern corresponding to FIG. 5b);

FIG. 6 is a view showing a frame format of the structure of star-shaped molybdenum particles;

FIG. 7 is a diagram showing the pentagonal and star-shaped molybdenum particles grown on an alumina substrate;

FIG. 8 is a scanning electron micrograph of a thin film configured from spherical fcc structure molybdenum particles;

FIG. 9 is a scanning electron micrograph of pentagonal and star-shaped molybdenum particles; and FIG. 10 is a graph showing the field electron emission property of the film.

DESCRIPTION OF REFERENCE NUMERALS

1. Insulating Narrow Tube
2. Gas Feed Pipe
3. Coil
4. Raw Material Metal Wire
5. Substrate
6. Substrate Brace with Position Adjustment Mechanism
7. High Frequency Power Source
8. High Frequency Matching Box

DETAILED DESCRIPTION OF THE INVENTION

Examples of the present invention are now explained with reference to the attached drawings. The ensuing explanation is provided for facilitating the understanding of the present invention, and such explanation of the examples is not intended to limit the present invention in any way. In other words, various modifications and working conditions based on the technical concept of the present invention shall be covered by this invention as a matter of course.

FIG. 1 is a view showing a frame format of the apparatus according to the present embodiment. The plasma source comprises an alumina narrow tube 1, a pipe 2 for supplying gas into the narrow tube, an RF electrode 3 for generating and maintaining plasma, and a metal wire 4 as the raw material of deposition material. FIG. 1 also shows a substrate 5, a substrate brace with a position adjustment mechanism 6, a high frequency power source 7, and a high frequency matching box 8. Although an alumina narrow tube is used herein as the narrow tube 1, the present invention is not limited thereto. The present invention can be worked so as long as the tube is an insulating narrow tube. Although the size of the narrow tube to be used can range from an internal diameter of several ten micrometers to several millimeters, when working the present invention in the atmosphere, it is preferable to use a narrow tube that is 2 mm or smaller so as to generate stable plasma. Needless to say, this system can be installed in a vacuum vessel and worked in the same manner. With the internally mounted raw material wire 4 shown in FIG. 1, it is desirable to insert one end to an area where the electrode is mounted, and to fix the other end to the inner wall of the metal tube (gas feed pipe).

The procedures for manufacturing molybdenum or tungsten particles having an fcc structure particles or a thin film formed from such particles using the foregoing plasma generator are now explained. The substrate 5 on which the particles are to be deposited is mounted at the downstream of the narrow tube 1 for generating plasma. Here, the distance between the nozzle of the narrow tube 1 and the surface of the substrate 5 is accurately controlled with the substrate brace 6 equipped with a micrometer. In order to efficiently synthesize the fcc particulates, it is desirable that this distance is several mm or less, but a greater distance may be more preferable depending on the conditions that the plasma is generated.

Subsequently, hydrogen/argon mixed gas is supplied into the alumina narrow tube, and high frequency of 450 MHz is applied to the electrode 3. High voltage is thereafter instantaneously applied via the conductive wire connected to the outer wall of the alumina narrow tube 1 so as to generate plasma. This yields the effect of instantaneously generating a spark in the tube and igniting the plasma as a result of applying high voltage. Nevertheless, even if high voltage is not applied, plasma will be generated over time if the state of applying high frequency is maintained for several ten seconds. If the spark discharge resulting from the application of high voltage will damage the raw material wire 4 and the substrate mounted at the downstream of the nozzle of the narrow tube 1, it would be desirable to employ the latter method. In addition, the high frequency used above may be substituted with other frequencies so as long as it is able to induce the plasma generation and maintain the plasma in the narrow tube 1. The gas to be supplied into the narrow tube 1 may also be substituted with other types of inert gas or mixed gas depending on the case, and any gas will suffice so as long as it is able to evaporate the raw material metal wire 4.

Once the plasma is generated, the plasma can be maintained by continuing to apply high frequency. During the generation of the plasma, the raw material wire 4 inserted into the narrow tube will gradually evaporate from the surface due to thermal conduction from the plasma or induction heating by high frequency, and become activated in the plasma. These active species, after arriving at the surface of the substrate 5, contribute to the particle growth or thin film deposition on the substrate 5.

Examples of specific results are shown below. The results shown below are based on the following manufacturing conditions. A molybdenum wire having a diameter of 200 micrometers was inserted into the alumina narrow tube having an internal diameter of 800 micrometers as shown in FIG. 1, and argon gas mixed with 4% hydrogen gas was supplied at a flow rate of 1000 ccm. High frequency of 20 to 25 W was thereafter applied to generate plasma, and the plasma discharged from the alumina narrow tube was irradiated for 30 minutes onto a tungsten substrate mounted 1 mm downstream from the nozzle. FIG. 2a is a scanning electron micrograph of the entire area irradiated with the plasma. The irradiated surface is visible in an area having a diameter of roughly 1 mm. When this irradiated area is observed via high magnification, creation of star-shaped particles as shown in FIG. 2b was observed. These star-shaped particles were created densely as shown in FIG. 2c across the entire irradiated area. In other words, it is evident that the irradiated area is a thin film configured from such star-shaped particles.

The electron diffraction pattern obtained from numerous particles that were peeled from the substrate and dispersed on a grid for transmission electron microscope observation is shown in FIG. 3. The lattice spacing (d value) of the particles calculated based on the foregoing pattern coincided with the d value (JCPDS No. 88-2331) of molybdenum having an fcc structure. Thus, it is evident that these particles are molybdenum particles having an fcc structure. The fact that these star-shaped particles are pentagonal is evident from the electron diffraction from the overhead view (FIG. 4b) of a single star-shaped particle (FIG. 4a). This diffraction pattern is a typical pattern obtained from a so-called five-fold symmetrical multiple twinning configured from 5 fcc structures. In a more detailed analysis of this electron diffraction pattern, it has been discovered that a twin plane {111} exists in the center of the 5 respective branches configuring the star shape. Consequently, it is possible to conclude that the synthesized star-shaped particles are configured from 5 fcc structures as shown in FIG. 4c.

The observation result of these star-shaped particles from a lateral direction is shown in FIG. 5. FIG. 5a shows a scanning electron microscope image, and FIG. 5b shows a transmission electron microscope image. From these observation results, it is evident that the particles are growing in a uniaxial direction. In addition, from the observation from an overhead view, it is evident that the 5 faces that appeared to be like branches are growing in the lateral direction pursuant to the particles growing in the uniaxial direction. The electron diffraction pattern that is an analysis result of the particles from a lateral direction is shown in FIG. 5c. From this analysis, it is evident that the particles are growing along orientation <110> of the five-fold symmetrical axis.

FIG. 6 is a view showing the frame format of the molybdenum star-shaped particles that were discovered from the foregoing structure analysis. With this process, it is possible to synthesize pentagonal molybdenum particles based on an fcc structure having the foregoing shape. There is no prior example of synthesizing pentagonal particles of molybdenum, and this is a substance that has been synthesized for the first time. In addition, as a result of the uniaxial growth and growth in the lateral direction, the size of the particles has reached several hundred nanometers. Since the particles are also synthesized as a thin film on the substrate, the measurement of physical properties of molybdenum having an fcc structure, which has not been achieved in the past, is now possible. Even with tungsten, a similar structure can be manufactured using the foregoing method.

Although a tungsten substrate was used for the synthesis in the foregoing example, it is also possible to form a similar structure on other types of metal substrates or nonconductive substrates. FIG. 8 is a scanning electron micrograph of pentagonal molybdenum particles formed on an alumina substrate. The molybdenum and tungsten fcc structure particles obtained with the method of the present invention are not limited to the foregoing pentagonal particles. By controlling the gas flow rate, it is possible to change the shape of the particles into a spherical shape or other shapes while maintaining the fcc structure. FIG. 7 is a diagram showing a molybdenum thin film synthesized with a gas flow rate of 500 ccm, and the other conditions being the same as the example described above. Although the configured particles are spherical, the crystal structure thereof is an fcc structure. The same results were obtained for tungsten, which belongs to the VI group metal, as with the example of molybdenum described above.

The film obtained by the present invention can be an effective field emission source. As seen in FIG. 9, each of the pentagonal and star-shaped molybdenum particles has a sharp tip and ridge lines. When voltage is applied to the film, the electric field is focused on these sharp portions and thus a high current value can be obtained by even low applied voltage. FIG. 10 is an example of the field electron emission property of the film, composed of star-shaped molybdenum particles. Generally in conventional molybdenum field emitter, ca. 650 V is required to obtain 10E-12 A at 5 micron gap. On the other hand, ca. 10E-12 A can be obtained by 350 V at 5 micron gap and 450 V at 10 micron gap in the invented film. These are much lower than that of conventional film, and it indicates high performance of the invented film as a field electron emission source.

As described above, the present invention enables to obtain molybdenum or tungsten particles having a face-centered cubic (fcc) crystal structure or a thin film formed from the foregoing particles, wherein the particles have a large-diameter particle structure that is thermodynamically stable or metastable; and molybdenum or tungsten particles having a face-centered cubic (fcc) crystal structure or a thin film formed from the foregoing particles, wherein the particles have a pentagonal particle structure. The size of such particles is several hundred nm, and the particles can be synthesized as a thin film. Accordingly, the present invention can be used to measure the physical properties of molybdenum or tungsten.

What is claimed is:

1. Molybdenum or tungsten particles having a face-centered cubic (fcc) crystal structure or a thin film formed from said particles, wherein said particles are five-fold symmetrical particles having a star-shaped cross-section.

2. The molybdenum or tungsten particles having a face-centered cubic (fcc) crystal structure or the thin film formed from said particles according to claim 1, wherein said particles are grown in a uniaxial direction along orientation <110> of a five-fold symmetrical axis.

3. The molybdenum or tungsten particles having a face-centered cubic (fcc) crystal structure or the thin film formed from said particles according to claim 1, wherein said particles have a structure laterally grown in a star shape from a five-fold symmetrical axis.

4. The molybdenum or tungsten particles having a face-centered cubic (fcc) crystal structure or the thin film formed from said particles according to claim 1, wherein said particles comprise a twin plane {111} in the center of a protrusion.

5. The molybdenum or tungsten particles having a face-centered cubic (fcc) crystal structure or the thin film formed from said particles according to claim 4, wherein said twin plane exists in the center of five respective branches configuring the star shape.

6. The molybdenum or tungsten particles having a face-centered cubic (fcc) crystal structure or the thin film formed from said particles according to claim 4, wherein average grain size of said particles is 50 nm or greater.

* * * * *